United States Patent
Zhu et al.

(10) Patent No.: US 11,748,009 B2
(45) Date of Patent: Sep. 5, 2023

(54) ERASURE CODING WITH OVERLAPPED LOCAL RECONSTRUCTION CODES

(71) Applicant: MICROSOFT TECHNOLOGY LICENSING, LLC, Redmond, WA (US)

(72) Inventors: Jianfeng Zhu, Shanghai (CN); Yiheng Tao, Shanghai (CN); Cheng Huang, Bellevue, WA (US); Aaron William Ogus, Woodinville, WA (US); Yilong Zhao, Shanghai (CN); Terry Chen, Shanghai (CN); Zhenshan Yu, Shanghai (CN); Tejas Shah, Redmond, WA (US); Sridhar Srinivasan, Shanghai (CN)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 17/059,873

(22) PCT Filed: Jun. 1, 2018

(86) PCT No.: PCT/CN2018/089534
§ 371 (c)(1),
(2) Date: Nov. 30, 2020

(87) PCT Pub. No.: WO2019/227465
PCT Pub. Date: Dec. 5, 2019

(65) Prior Publication Data
US 2021/0208782 A1    Jul. 8, 2021

(51) Int. Cl.
*G06F 11/10*    (2006.01)
*G06F 3/06*    (2006.01)

(52) U.S. Cl.
CPC .............. *G06F 3/064* (2013.01); *G06F 3/067* (2013.01); *G06F 11/1004* (2013.01)

(58) Field of Classification Search
CPC ...... G06F 3/064; G06F 3/067; G06F 11/1004; G06F 11/1012; G06F 11/1076; H03M 13/373
See application file for complete search history.

(56) References Cited

U.S. PATENT DOCUMENTS

| 7,904,782 B2 | 3/2011 | Huang et al. |
| 7,930,611 B2 | 4/2011 | Huang et al. |

(Continued)

FOREIGN PATENT DOCUMENTS

| CN | 101512492 A | 8/2009 |
| CN | 106294026 A | 1/2017 |
| WO | 2012007715 A2 | 1/2012 |

OTHER PUBLICATIONS

"Final Office Action Issued in U.S. Appl. No. 13/926,722", dated Oct. 30, 2015, 6 Pages.

(Continued)

*Primary Examiner* — Than Nguyen
*Assistant Examiner* — Janice M. Girouard

(57) ABSTRACT

Various embodiments, methods, and systems for erasure coding with overlapped local reconstruction codes, are provided. An erasure coding scheme can be defined based on Overlapped Local Reconstruction Codes (OLRC) that achieve high storage efficiency by providing fault tolerance properties that optimize reconstruction for common cases of failures while maintaining the reconstruction costs for uncommon case of failures. In operation, a data chunk is divided into data fragments. The data fragments correspond to zones. A plurality of parity fragments is computed using the data fragments. A parity fragment is computed using a subset of the data fragments. The plurality of parity fragments are assigned to the zones comprising the data fragments, where the data fragments and the plurality of parity fragments define overlapped local construction codes having (Continued)

a plurality of local groups. An unavailable data fragment is recoverable from at least two local groups from the plurality of local groups.

20 Claims, 6 Drawing Sheets

(56) References Cited

U.S. PATENT DOCUMENTS

| | | | |
|---|---|---|---|
| 8,051,362 B2 | 11/2011 | Li et al. | |
| 8,171,379 B2 | 5/2012 | Adarshappanavar et al. | |
| 8,316,260 B1 | 11/2012 | Bonwick | |
| 8,364,891 B2 | 1/2013 | Margolus et al. | |
| 8,433,849 B2 | 4/2013 | De et al. | |
| 8,458,287 B2 | 6/2013 | Ozzie et al. | |
| 8,473,778 B2 | 6/2013 | Simitci et al. | |
| 8,621,330 B2 | 12/2013 | Yekhanin et al. | |
| 9,141,679 B2 | 9/2015 | Gopalan et al. | |
| 9,378,084 B2 | 6/2016 | Calder et al. | |
| 2005/0229023 A1 | 10/2005 | Lubbers et al. | |
| 2006/0242542 A1 | 10/2006 | English et al. | |
| 2007/0089045 A1 | 4/2007 | Corbett et al. | |
| 2012/0221533 A1 | 8/2012 | Burness et al. | |
| 2014/0040702 A1 | 2/2014 | He et al. | |
| 2014/0380125 A1 | 12/2014 | Calder et al. | |
| 2014/0380126 A1* | 12/2014 | Yekhanin | H04L 67/1097 714/766 |
| 2017/0255510 A1 | 9/2017 | Kan et al. | |

OTHER PUBLICATIONS

"Non Final Office Action Issued in U.S. Appl. No. 13/926,722", dated Mar. 27, 2015, 7 Pages.

Office Action and Search Report Issued in Taiwanese Patent Application No. 103118465, dated Aug. 28, 2017, 5 Pages.

"First Office Action and Search Report Issued in Chinese Patent Application No. 201480036690.4", dated Dec. 22, 2017, 12 Pages.

Datta, et al., "Storage Codes: Managing Big Data with Small Overheads", In the Proceedings of IEEE International Symposium on Network Coding, NETCOD 2013, Jun. 7, 2013, pp. 1-6.

Kermarrec, et al., "Repairing Multiple Failures with Coordinated and Adaptive Regenerating Codes", In International Symposium on Networking Coding, IEEE, Jul. 25, 2011, 13 Pages.

"International Search Report and Written Opinion Issued in PCT Application No. PCT/CN18/089534", dated Mar. 7, 2019, 8 Pages.

"International Preliminary Report on Patentability Issued In PCT Application No. PCT/US2014/043857", dated Aug. 24, 2015, 7 Pages.

"Second Written Opinion Issued in PCT Application No. PCT/US2014/043857", dated May 27, 2015, 6 Pages.

"Internation Search Report and Written Opinion Issued In PCT Patent Application No. PCT/US2014/043857", dated Nov. 11, 2014, 11 Pages.

"Office Action Issued in European Patent Application No. 14740083.2", dated Mar. 14, 2017, 3 Pages.

"Extended European Search Report Issued in European Patent Application No. 18920511.5", dated Dec. 23, 2021, 7 Pages.

* cited by examiner

Group 1 – {x0, x1, x2, y0, y1, y2, $P_{xy0}$, $P_{xy1}$, $P_{xy2}$}

Group 2 – {y0, y1, y2, z0, z1, z2, $P_{yz0}$, $P_{yz1}$, $P_{yz2}$}

Group 3 – {z0, z1, z2, x0, x1, x2, $P_{zx0}$, $P_{zx1}$, $P_{zx2}$}

ERASURE CODING WITH OVERLAPPED LOCAL RECONSTRUCTION CODES

BACKGROUND

Users often rely on applications and services to perform computing tasks. Distributed computing systems (e.g., cloud computing platforms) are computing architectures that support network access to a shared pool of configurable computing and storage resources. Distributed computing systems may use fault-tolerant storage techniques for proficient and dependable storage of data. In particular, erasure coding techniques may be employed to reduce storage overhead. Erasure coding may be implemented across storage nodes (e.g., disks, servers and racks). Erasure coding can provide efficient recovery of missing data (e.g., data fragments) based on local protection groups that define local dependencies between code data fragments. Local protection groups can be implemented with varying complexities and structures to support different fault tolerance properties of erasure coded data when recovering missing data. As such, erasure coding schemes can be generated to accommodate specific dimensions or trade-offs, such as cost, performance, and reliability.

SUMMARY

Embodiments of the present invention relate to methods, systems, and computer storage media for providing a zone redundant storage system that supports erasure coding with overlapped local reconstruction codes ("OLRC"). By way of background, in modern data centers, it is common to find storage machines temporarily or permanently down for software or hardware problems, causing data or files on the machine to be inaccessible. In order to achieve high availability for data stored in data centers, especially when some machines are down, fault tolerant technologies are commonly adopted; for example, data replication and erasure coding. The first approach, data replication, generally refers to storing multiple copies of the same data on several machines, so that even with one or more machines down, the data can still be accessed from other available copies of the data. However, a drawback of this solution is its high storage overhead. The second approach, erasure coding, generally refers to error correction algorithms that function to recover from failures of stored data. Erasure coding divides an original data chunk into data fragments and uses the data fragments to generate parities (i.e., parity fragments), and then stores all the data fragments and parity fragments on different machines. Even with some data fragments being inaccessible, due to one machine being down, the data can still be reconstructed from a remaining set of available data fragments and parity fragments. Since additional storage is only for parity fragments of the original data, the storage overhead is much lower than data replication.

A zone redundant storage system is a system that is composed of machines in multiple zones, and zone redundant storage is designed to tolerate large-scale outages, which means even with machines in one zone being temporarily or permanently down (e.g., a power outage or a building collapsing) the data availability would not be impacted. By way of example, in a zone redundant storage system, a rack may have multiple nodes and data in placed on nodes in separate racks, where racks are in different zones. As such, there may be 3 zones, each zone having multiple storage nodes in racks. Data can be split up into data chunks across zones and with data fragments across storage nodes to handle both zone failures and storage node failures. One fault tolerance goal of the zone redundant storage system is to have total availability of all data fragments with a zone failure and maximize availability of data fragments in case of storage node failures.

By way of background, with reference to a 3 zone scenario, conventional zone redundant storage systems may implement an erasure coding scheme that provides specific fault tolerance properties for an uncommon case and a common case. In the uncommon case, fault tolerance is provided for a zone failure and 3 additional storage node failures, and in the common case, without any zone failures, fault tolerance is provided for up to 9 storage node failures. Note that the reconstruction of data fragments in zone failures or storage nodes failures incur the same cost (reading 9 data fragments) for reconstruction, even though storage node failures are more common than zone failures. In this regard, a conventional erasure coding implementation is not optimized for the common case.

Embodiments described in the present disclosure are directed towards technologies for improving erasure coding schemes in a zone redundant storage system using overlapped local reconstruction codes ("OLRC"). The OLRC addresses the issue of zone redundant storage systems having fault tolerance that is not optimized for a common case (i.e., storage node failures) compared to the uncommon case (i.e., zone failures). OLRC optimizes reconstruction for the common case while maintaining the reconstruction costs for the uncommon case. The OLRC offers the novel combination of fault tolerance properties for the uncommon case and the common case, where the OLRC further supports zone long-term downtime operations for disaster recovery. Moreover, the durability of the OLRC is the same as a zone redundant storage system. By way of example, for the uncommon case, as before, 3 additional storage node failures can be tolerated, in addition to a zone failure, with reconstruction cost of reading 9 fragments; and now, for the common case, when there is no zone failure, reconstruction incurs less cost with reading only 6 fragments. Storage cost remains the same compared to a conventional code like Reed-Solomon ("RS") code, while optimizing for reconstruction (e.g., repair costs and degraded reads).

OLRC is possible because the parity fragments are not generated with all data fragments, but instead with a specific subset of data fragments. For example, OLRC does not use 9 data fragments to generate parity fragments and uses only 6 data fragments. The parity fragments are specifically generated as optimal erasure codes that have the property that any k out of n coded symbols are sufficient to recover the original data, as discussed herein in more detail. Different embodiments of the ORLC can be generated and further the OLRC can support novel disaster recovery operations and configurations. For example, in one embodiment, the OLRC is constructed with horizontal placement of parity fragments, and in another embodiment, the OLRC is constructed with interlaced placement of parity fragments. Moreover, an OLRC can be reconstructed upon one zone failure to support a zone long-term downtime, each discussed herein in more detail.

Accordingly, one embodiment of the present invention provides improved erasure coding with overlapped local reconstruction codes. In operation, a data chunk is divided into data fragments. The data fragments correspond to zones. A plurality of parity fragments is computed using the data fragments. A parity fragment is computed using a subset of the data fragments. The plurality of parity fragments are assigned to the zones comprising the data fragments, where the data fragments and the plurality of parity fragments define overlapped local construction codes having a plurality of local groups. An unavailable data fragment is recoverable from at least two local groups from the plurality of local groups.

As such, embodiments described herein are directed to an OLRC that provides a fault-tolerant erasure coding scheme with improved balance between reconstruction, including repair costs, read efficiency, and high durability while keeping storage overhead at minimal. With erasure coding schemes, the number of data fragments and parity fragments needed for reconstruction operates as a measure of the efficiency of the erasure coding scheme. With OLRC, reconstruction only requires a small fraction of the total number of data fragments and parity fragments from the same local group, which would make the scheme ideal in storage systems having a limited number total data fragments. Overall, the OLRC provides improvement to computing operations for recovering missing data, which results in computing efficiency in processing of data access requests in a distributed computing system.

This summary is provided to introduce a selection of concepts in a simplified message that are further described below in the detailed description. This summary is not intended to identify key features or essential features of the claimed subject matter, nor is it intended to be used in isolation as an aid in determining the scope of the claimed subject matter.

BRIEF DESCRIPTION OF THE SEVERAL VIEWS OF THE DRAWINGS

The present technology is described in detail below with reference to the attached drawing figures, wherein.

DETAILED DESCRIPTION

Figure 1:
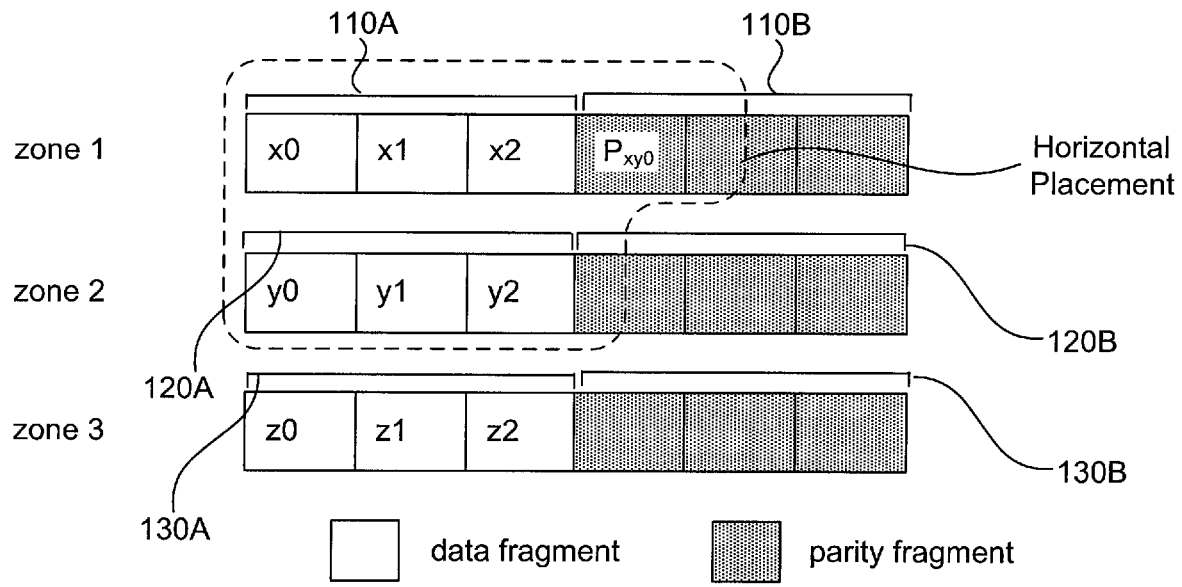
FIG. 1 is a schematic diagram showing an example erasure coding scheme, in accordance with embodiments of the present invention.

Generally, fault tolerance refers to the capacity for a system to continue operating in the event of failure (or one or more faults) of some of its components. Commonly used fault tolerance techniques include data replication and erasure coding. In particular, erasure coding refers to error correction algorithms that function to recover from failures of stored data. Data may be stored in different types of storage hardware with different types of storage services. Erasure coding may be implemented to provide fault-tolerance for stored data, so that if a data fragment is unavailable, due to a host machine being down, the data could be reconstructed using available data fragments and parity fragments. In addition, erasure coding may also provide reduced storage overhead. For example, instead of replicating data, the data may be divided into data fragments and associated with one or more parity fragments and then the data fragments are stored with the ability to reconstruct missing data fragments from remaining data fragments. As such, erasure coding provides cost savings in hardware, data center footprint, and power savings from not having to run the additional hardware.

Generally, erasure coding includes encoding data with particular types of coding schemes, for example, a Reed-Solomon, which is normally represented as RS (K, M), where K is the number of data fragments, and M is the number of parity fragments. In the Reed-Solomon approach, every parity fragment is generated by linear computation of all k data fragments, this aspect of the Reed Solomon approach results in a high number of data fragments required for reconstruction reads, thus affecting the read efficiency and increasing repair cost for unavailable data fragments or parity fragments. Another type of coding scheme is the Local Reconstruction Codes (LRC), Local Reconstruction Codes may be formally defined as (k, l, r). A (k, l, r) LRC divides k data fragments into l groups, with k/l data fragments in each group. The erasure coding scheme computes one local parity fragment within each group. In addition, the erasure coding scheme includes computing r global parity fragments from all the data fragments. By way of example, let n be the total number of fragments (data fragments+parity fragments). Then n=k+l+r. Thus, the normalized storage overhead is n/k=1+(l+r)/k. The LRC in this example is a (6, 2, 2) LRC with storage cost of 1+4/6=1.67×. Various erasure codes are detailed in U.S. patent application Ser. No. 14/752,595, filed Jun. 26, 2015, entitled "FLEXIBLE ERASURE CODING WITH ENHANCED LOCAL PROTECTION GROUP STRUCTURES," which is herein incorporated by reference in its entirety.

Optimal erasure codes have the property that any k out of n coded symbols are sufficient to recover the original data. Optimal erasure codes are maximum distance separable (MDS) codes. In particular, linear block codes that achieve this quality in the Singleton bound are called MDS code. Reed-Solomon codes and their extended versions are MDS codes. A Reed-Solomon implementation may include 6 data fragments and 3 parity fragments for recovering the 6 data fragments. As shown above, compared to Reed-Solomon, LRC reduces the number of erasure coding fragments that need to be read when reconstructing data fragments that are offline, while keeping storage overhead low. For example, with 6 data fragments, LRC generates 4 parity fragments instead of 3. Two local parity fragments, each associated with different sets of 3 data fragments out of the 6 fragments and two global parity fragments for the 6 data fragments. So in contrast to Reed-Solomon, that uses a parity fragment and 5 data fragments to reconstruct a failed data fragment, LRC uses a local parity fragment and 2 data fragments in the same set to reconstruct the failed data fragment. LRC provides more flexibility than Reed-Solomon in balancing storage overhead versus reconstruction cost. For the above example, LRC adds one more parity fragment than Reed-Solomon, while reducing reconstruction cost by half. Alternatively, LRC can keep the same reconstruction cost as Reed-Solomon while reducing the storage overhead significantly.

Further, LRC codes may be determined based on coding equations chosen such that the LRC achieves a maximally recoverable (MR) property, which means it can decode any failure pattern which is information-theoretically decodable. For example, with reference to the example above, if a set of 3 data fragments and the parity fragment associated with the data fragments fail, the pattern is non-decodable because the remaining two parities cannot decode the 3 data fragments, thus are information-theoretically non-decodable. Otherwise, failure patterns that are possible to reconstruct are called information-theoretically decodable. An LRC may be associated with single set of coding equations that achieve maximally recoverable property.

A storage system (e.g., a distributed computing system running a storage service) can be governed by the following three basic considerations. Firstly, the data can be stored for reliability, (i.e., store data in a redundant encoded form) ensuring that if a bounded number of machines, storage nodes, or datacenter zones fail no information is lost. Secondly, the data can be stored for availability, in that the data is available for the users, (i.e., no correlated failure—within bounds—should render any piece of the data unavailable). Finally, the data can be stored to limit redundancy where storing too much redundant data limits optimization of the overall storage cost.

With erasure codes, efficient recovery of missing data fragments can be achieved. By way of background, with reference to a 3 zone scenario, conventional zone redundant storage systems may implement an erasure coding scheme (e.g., RS (9,9)) that provides specific fault tolerance properties for an uncommon case and a common case. In the uncommon case, fault tolerance is provided for a zone failure and 3 additional storage node failures, and in the common case, without any zone failures, fault tolerance is provided for up to 9 storage node failures. Note that the reconstruction of data fragments in zone failures or storage node failures incur the same cost (reading 9 data fragments) for reconstruction, even though storage node failures are more common than zone failures. In this regard, a conventional erasure coding implementation is not optimized for the common case.

Embodiments described in the present disclosure are directed towards simple and efficient methods for improving a zone redundant storage system using erasure coding with overlapped local reconstruction codes. At a high level, OLRC is an erasure coding scheme constructed to flexibly operate with zone redundant storage systems, even with a dynamic total number of zones. Erasure coding based on overlapped local reconstruction codes addresses an issue in conventional erasure coding implementations where fault tolerance is not optimized for a common case (i.e., storage node failures) compared to the uncommon case (i.e., zone failures). OLRC optimizes reconstruction for the common case while maintaining the reconstruction costs for the uncommon case. The OLRC offers the novel combination of fault tolerance properties for the uncommon case and the common case. By way of example, for the uncommon case, as before, 3 additional storage node failures can be tolerated in addition to a zone failure, with reconstruction cost of reading 9 fragments; and now, for the common case, when there is no zone failure, reconstruction of incurs less cost of reading only 6 fragments. Storage cost remains the same compared to a conventional implementation, while optimizing for reconstruction (e.g., repair costs and degraded reads). OLRC is possible because the parity fragments are not generated with all data fragments, but instead with a specific subset of data fragments.

Further, in a conventional LRC implementation, any individual data fragment of a plurality of data fragments of a data chunk only exists in one local protection group with a single local parity. If there are not enough data fragments in a local group for a reconstruction read for the data fragment, when the data fragment is inaccessible, then a reconstruction operation for the missing data fragment includes global reconstruction reads, which executes more reads for reconstructing the missing data fragment. OLRC for the zone redundant storage systems provides improved balance between failure tolerance and effective reconstruction. For example, OLRC has more flexibility in that every local group is constructed to have multiple local parities. As such, a local group can be used for local reconstruction as each data fragment is part of two local protection groups, so read efficiency and average repair cost for OLRC is improved over LRC.

In operation, erasure coding data can be performed across multiple storage zones and subzones. This may be accomplished by dividing a data chunk into a plurality of data fragments. Each of the plurality of data fragments is associated with a zone. Zones comprise geographic regions, buildings, data centers, and storage nodes associated with a storage service. A plurality of reconstruction parity fragments is computed based at least in part on trade-offs or dimensions of each erasure coding scheme. In particular, dimensions, such as cost, performance, and reliability define implementation constraints associated with the OLRC scheme across zones. The OLRC coding scheme specifies the placement of erasure coded data to achieve specific goals for fault-tolerance.

The OLRC erasure coding scheme defines how to divide a data chunk into a plurality of data fragments, and optimal placement of the data fragments in machines across zones to achieve specific goals and OLRC properties for fault-tolerance. For example, with OLRC, a plurality of parity fragments are computed with only a subset of all data fragments. In particular, the ORLC parity fragments can be based on horizontal placement or interlaced placement. The data fragments, used to compute a single parity fragment, could come from different zones, and individual data fragments could be used to compute several parity fragments. Finally, the generated parity fragments may be placed on machines across zones, and in particular, the OLRC may employ an interlaced placement strategy that includes placing parity fragments in zones, different from all its source data fragments. Cross-zone parity fragments provide cross-zone reconstruction for unavailable data segments, due to a host machine being down, thus superior failure tolerance can be achieved with OLRC.

For purposes of a detailed discussion below, embodiments of the present invention are described with reference to erasure coding data across multiple zones based on an erasure coding scheme that is schematically depicted for three zones; however, the three zones depicted herein are merely exemplary and it is contemplated that a plurality of zones may be utilized with the erasure coding scheme described herein. Similarly, for the number of data fragments and parity fragments number, the erasure coding scheme is schematically depicted for codes with 9 data fragments and 9 parity fragments which is merely exemplary, and it is contemplated that different numbers for data fragments and parity fragments may be utilized.

With continued reference to OLRC, OLRC is defined as OLRC (k, z, l, n), where k is the total number of data fragments, z is the total number of zones, l is a zone count, where all data fragments from the zones in the zone count are used to compute parity fragments, n is the number of parity fragments per local group. OLRC includes k/z data fragments in each zone with a storage overhead of $(k+n*z)/k$, the normalized storage overhead is $1+n*z/k$, for an exemplary 3 zones case that has 9 data fragments, 3 parity fragments in each group, the storage overhead is $1+3*3/9=2\times$. For example, with reference to the ORLC in FIG. 1, based on OLRC (9, 3, 2, 3).

With reference to FIG. 1, FIG. 1 illustrates an OLRC (9, 3, 2, 3). FIG. 1 includes zone 1, zone 2, zone 3, data fragment portion 110A, data fragment portion 120A, and data fragment portion 130A, parity fragment portion 110B, parity fragment portion 120B, parity fragment portion 130B. A portion of a zone comprising only data fragments may be referred to as the data fragment portion of the zone and a portion of the zone having only parity fragment. Data chunk 100 is divided into the three zones. Data chunk 100 is divided into nine data fragments referred to as zone data fragments (x0, x1, x2), (y0, y1, y2), (z0, z1, z2), then placed into the three zones in corresponding data fragment portions (i.e., data fragment portion 110A, data fragment portion 120A, and data fragment portion 130A). Each zone with three data fragments in the same zone fragment combinations corresponding to zone 1, zone 2, and zone 3. Since l is 2, for OLRC (9, 3, 2, 3), all data fragments from two zones are used to generate one parity fragment. As shown in FIG. 1, to compute $P_{xy0}$, (x0, x1, x2, y0, y1, y2) (i.e., all six fragments from zone 1 and zone 2) are used. To generate remaining two parity fragments $P_{xy1}$ and $P_{xy2}$, in zone 1, (x0, x1, x2, y0, y1, y2) are used. Similarly, generating the 3 parity fragments in zone 2 is based on (y0, y1, y2, z0, z1, z2), and the 3 parity fragments in zone 3 are generated based on (z0, z1, z2, x0, x1, x2), as shown in FIG. 2.

Figure 2:
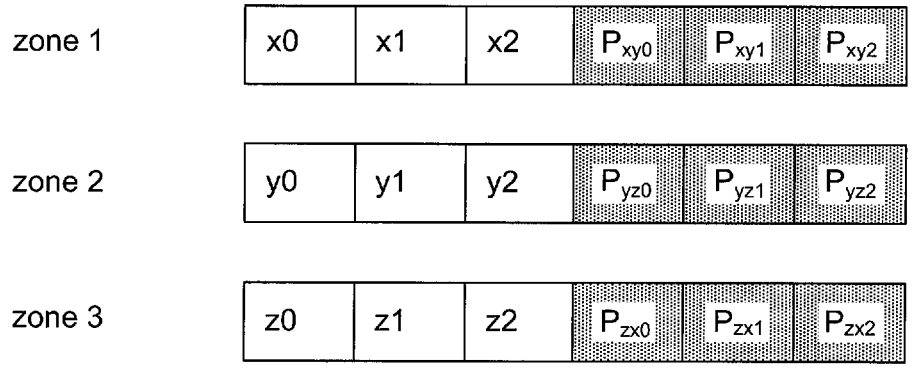
FIG. 2 is a schematic diagram showing an example erasure coding scheme, in accordance with embodiments of the present invention.

With continued reference to FIG. 2, FIG. 2 illustrates the data fragments and parity fragments of data chunk 100 generated using a horizontal placement strategy (i.e., a horizontal placement operation). At a high level, assigning parity fragments in zones that includes the source data fragments (i.e., data fragment used in computing the parity fragments) may be referred to as OLRC horizontal placement. The zones having the data fragments and parity fragments define local groups or local protection groups (e.g., group 1, group 2, and group 3). For OLRC (9, 3, 2, 3), there are three local groups: Group 1—{x0, x1, x2, y0, y1, y2, $P_{xy0}$, $P_{xy1}$, $P_{xy2}$}; Group 2—{y0, y1, y2, z0, z1, z2, $P_{yz0}$, $P_{yz1}$, $P_{yz2}$} and Group 3—{z0, z1, z2, x0, x1, x2, $P_{zx0}$, $P_{zx1}$, $P_{zx2}$}. The OLRC erasure coding scheme provides particular properties in fault tolerance. With OLRC horizontal placement, having all data fragments and parity fragments, as shown in FIG. 2, the OLRC may support both primary-local-group recovery and secondary-local-group type recovery. For example, for primary-local-group type recovery, when a single data fragment is lost, the data fragment can be recovered by reconstructing the data fragment from 6 out of remaining 8 data fragments in the same local group. For example, x0 may become unavailable because its host machine is having hardware issues. To reconstruct x0, any 6 out of 8 fragments (i.e. x1, x2, y0, y1, y2, $P_{xy0}$, $P_{xy1}$, $P_{xy2}$) can be accessed. With secondary-local-group type recovery, the alternative may be to reconstruct x0 by selecting 6 fragments from another local group (e.g., Group 3) that includes x1, x2, z0, z1, z2, $P_{zx0}$, $P_{zx1}$, $P_{zx2}$. Optional reads with any 6 out of 8 can be performed to reduce tail latency, discussed below in more detail.

With the LRC coding scheme, any individual data fragment only exists in one local group. If there are not enough data fragments in a corresponding local group for a reconstruction operation or degraded read operation, then the operation becomes a global reconstruction operation or global degraded read operation which incurs more cost. On the other hand, OLRC is constructed such that the structure provides flexibility to support more local operations as each data fragment is part of two local groups. In this regard, read efficiency and average repair cost for OLRC would be better than LRC. Since each local group has 3 parity fragments, the local group can tolerate any three fragments offline and recover by local reconstruction. If more fragments are offline (e.g., a zone failure), then local reconstruction is not as beneficial, in that case, reconstruction operations leverage data from other local groups which have overlapped fragments with the group that is being recovered, with data fragments from other local groups based on global reconstruction.

TABLE 1

OLRC failure tolerance for node failures

| Node Failure | Recoverability |
|---|---|
| <7 | 100% |
| 7 | 99.66% |
| 8 | 97.72% |
| 9 | 91.50% |
| >=10 | 0 |

For OLRC (9, 3, 2, 3), a storage service could tolerate all arbitrary 6 or less data fragments unavailable cases, for less than or equal to 3 data fragments down cases, which are recoverable using local groups, while for more than 3 fragments down cases, depends on how the lost data fragments are distributed among groups. Recovery is possible from several local group reconstructions, if the count of the individual local group data fragments that are down is less than or equal to 3, otherwise a global reconstruction is needed. For more than 6 fragments down cases, many cases would be theoretically unrecoverable, for 7/8/9 fragments down scenario; more than 90% cases are still recoverable for OLRC. Table 1 above illustrates full recoverability scenarios for node failures.

Furthermore, as discussed, OLRC maintains LRC fault tolerance properties in the uncommon case with a single zone failure. Zone redundant storage is designed to tolerate large-scale outages (e.g., a building collapsing, a data center burns down, or a weather-related damage). Fault tolerance under one zone failure scenario is a key measure to evaluate fault tolerance effectiveness for any erasure coding scheme. OLRC (9, 3, 2, 3) with the horizontal placement illustrated in FIG. 2, with any one zone down, for example, zone 1 is down, the zone redundant storage system could only tolerate up to 6 arbitrary fragments unavailable. If zone 1 is down making fragments x0, x1, x2, $P_{xy0}$, $P_{xy1}$, $P_{xy2}$ unavailable, the fragments in the remaining two zones could still tolerate up to 3 fragments down like extra fragments {y0, y1, y2}, but there are many cases that one extra node failure in remaining two zones could cause data unavailability. For example, if extra node for $P_{zx0}$ in zone 3 is down, full down node list is {x0, x1, x2, $P_{xy0}$, $P_{xy1}$, $P_{xy2}$, $P_{zx0}$} which is an unrecoverable case since for fragments hold data from $x_i$, 7 fragments unavailable while only could tolerate 6 ones as total count for parities hold data from $x_i$ is only 6.

Figure 3:
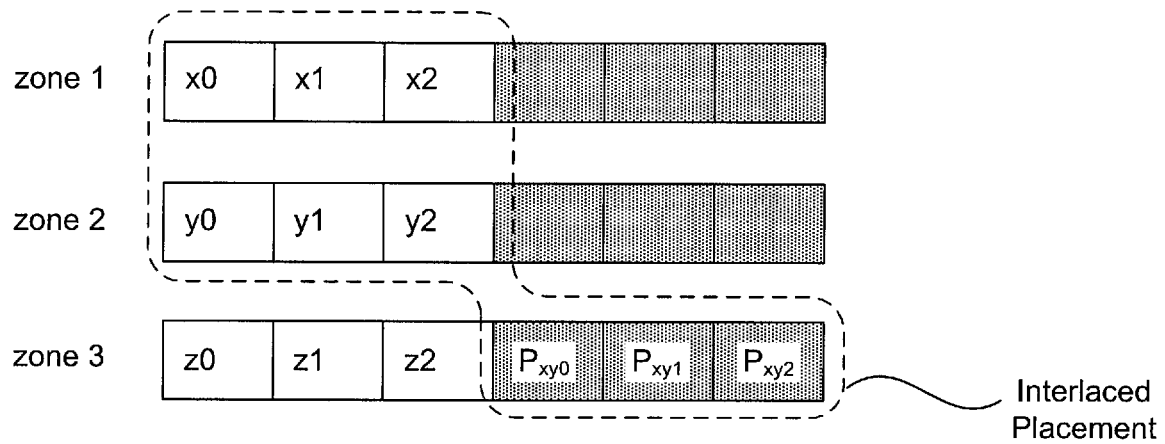
FIG. 3 is a schematic diagram showing an example erasure coding scheme, in accordance with embodiments of the present invention.

OLRC can also be implemented with interlaced placement (i.e., interlaced placement operation) of parity fragments. With reference to the horizontal placement of parity fragments in FIG. 2, there are 6 fragments from the same local group with one zone down; for example, in zone 1, {x0, x1, x2, $P_{xy0}$, $P_{xy1}$, $P_{xy2}$} are from the same group. OLRC with interlaced placement of parity fragments avoids too many fragments from the same group going down, when a zone failure down occurs, by interlaced placement of parity fragments away from their source data fragments. For example, as shown in FIG. 3, parity fragments from X and Y are placed in zone 3 which is different from their corresponding source fragments X (zone 1) and Y (zone 2).

Figure 4:
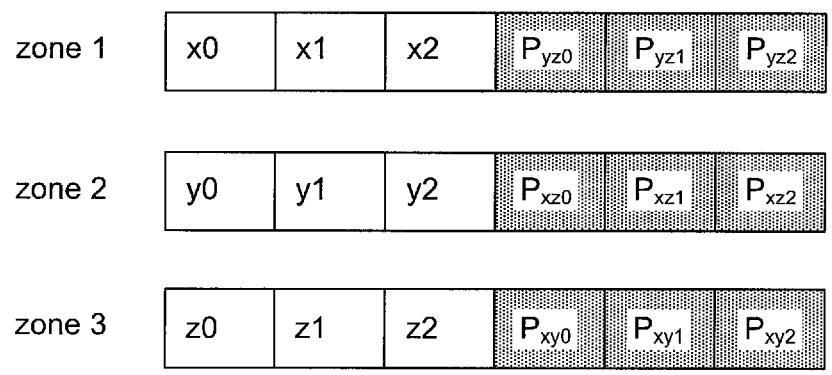
FIG. 4 is a schematic diagram showing an example erasure coding scheme, in accordance with embodiments of the present invention.

With reference to FIG. 4, FIG. 4 illustrates data chunk 110 arranged based on interlaced placement technique. In particular, the parity fragments are placed based on the interlaced placement. With interlaced placement for parity fragments, when one zone is down, the system can tolerate any arbitrary 3 or less extra fragments down, which greatly improves failure tolerance for one zone down scenario. For example, when zone 1 is down plus one extra node for a parity fragment generated from x, down, the zone 1 and the extra node are not recoverable under placement in FIG. 2 as discussed above, the unavailable node list is {x0, x1, x2, $P_{xy0}$, $P_{xy1}$, $P_{xy2}$, $P_{zx0}$}. With the interlaced placement shown in FIG. 4, the unavailable node list for zone 1 down plus one extra node for a parity fragment generated from x, would be {x0, x1, x2, $P_{yz0}$, $P_{yz1}$, $P_{yz2}$, $P_{zx0}$}, since maximum count of data fragments for one group is 4 {x0, x1, x2, $P_{zx0}$}, this is a recoverable case and can be extended to up to 3 extra nodes down for parity fragments with data from $x_i$, since for fragments that hold data from $x_i$, it could tolerate up to 6 fragments that are unavailable.

OLRC also provides support for improved degraded reads. As used herein, recovery may refer to either reconstruction or degraded reads of fragments. When a fragment is unavailable, reconstruction reads are required to serve read requests, and the read latency is often degraded due to reading multiple fragments. For degraded reads, since local degraded reads requires less fragments than global degraded reads, less fragments means less read I/Os, so global degraded reads are the last option. With OLRC erasure coding scheme, each data fragment participates in more than one group, and for each local group, there is more than one parity fragment; which is a benefit for a degraded read. One data fragment participates in more than one group, which means when a need exists to perform a degraded read or a reconstruction of this specific data fragment, local degraded read or reconstruction could be performed for any group from the ones where the data fragment participates for parity generation. Moreover, there exist more options for selecting a reconstruction group based on the status of data fragments status in a group. And, with more than one parity fragment in a local group, the bandwidth has faster local reconstruction, since it only needs part of the data fragments in local group to do decoding. Advantageously, there exists a tail latency benefit in that multiple local parities can effectively weed out slow nodes.

By way of example, take OLRC (9, 3, 2, 3), every individual data fragment, is part of two groups, and for each group, there are 3 parities which are generated from all six data fragments in the group. Consider x0 down case, since x0 is part of two groups—{x0, x1, x2, y0, y1, y2, $P_{xy0}$, $P_{xy1}$, $P_{xy2}$}, {x0, x1, x2, z0, z1, z2, $P_{zx0}$, $P_{zx1}$, $P_{zx2}$}, so to recover x0, a reconstruction operation can either use any of the two groups based on data fragments availability status in the group. Meanwhile, for a selected group, for example group {x0, x1, x2, y0, y1, y2, $P_{xy0}$, $P_{xy1}$, $P_{xy2}$}, to perform a reconstruction operation for x0, decoding would only need 6 fragments, which means reads from any 6 fragments in {x1, x2, y0, y1, y2, $P_{xy0}$, $P_{xy1}$, $P_{xy2}$} could work for x0 recovery. In operation, if a reconstruction is based on issuing 8 reads out for reconstruction, then when only 6 read responses for the reconstruction operation are processed, a tail latency problem is mitigated. The basis for the mitigation relates to individual nodes, that may have slow response times (e.g., slow network or disks) are no longer detrimental (e.g., causing long reconstruction latency) as the last two slowest reads can be omitted.

In addition, network communication cost across zone boundaries is more expensive and also have higher latency compared to communication within a zone. As such, for both local and global reconstruction, the reconstruction operation prioritizes reconstruction reads based on available nodes from local groups in the same zone, and performs reads across zones only as needed, in order to optimize reconstruction latency. It is further contemplated that the OLRC implementation can be extended to more than 3 zones, without impacting the properties for storage overhead and local reconstruction efficiency, because a zone count is not a dispositive element for the erasure coding scheme OLRC (k, z, l, n).

In one implementation of OLRC in accordance with embodiments described herein, the OLRC can be leveraged to provide improvement for scenarios when a zone is down for an extended period (i.e., zone long-term downtime). As mentioned in above section about tail latency, for OLRC, even with one zone down, the OLRC could still tolerate 3 extra arbitrary node failures. For example, if a customer wants to access the data in a failed zone, it could serve the read request by reconstructing data fragments on the fly (i.e., degraded reads). However, as discussed above, the latency for a reconstruction read would be much more expensive than a direct data fragment read. For example, if a zone has a failure that is expected to take a prolonged period to recover, it may be advantageous to migrate and/or reconstruct data fragments from the down zone in the remaining healthy zones to optimize read performance. For example, if a zone is down due to an earth quake in one region, and it could take weeks or even months to repair or to rebuild the down zone. In the ideal situation, there should be no increase in the storage capacity for remaining two zones after migration, and the remaining fragments after migration should maintain the fault tolerance properties during node failures.

In one implementation, a codec transition operation can be performed. Codec transition may refer to the process of converting data coded with codec A to be encoded with another codec B, based on initially decoding the data to replicates and then redoing erasure coding with new codecs. By way of example, OLRC (9, 3, 2, 3), under a zone long-term downtime scenario, the data may be coded to a Cauchy Reed-Solomon codec CRS (9,3) for data fragments in the remaining two zones, which keeps 12 fragments with 9 data fragments and 3 global parity fragments. The CRS meets the requirement for capacity and failure tolerance as the CRS would tolerate arbitrary 3 node failures. However, the intermediate processing of decoding and re-encoding during codec transition may be time consuming, and the network cost for transferring data across nodes may be very expensive (e.g., 5x), along with the cost for codec transition work when the zone is recovered.

Figure 5:
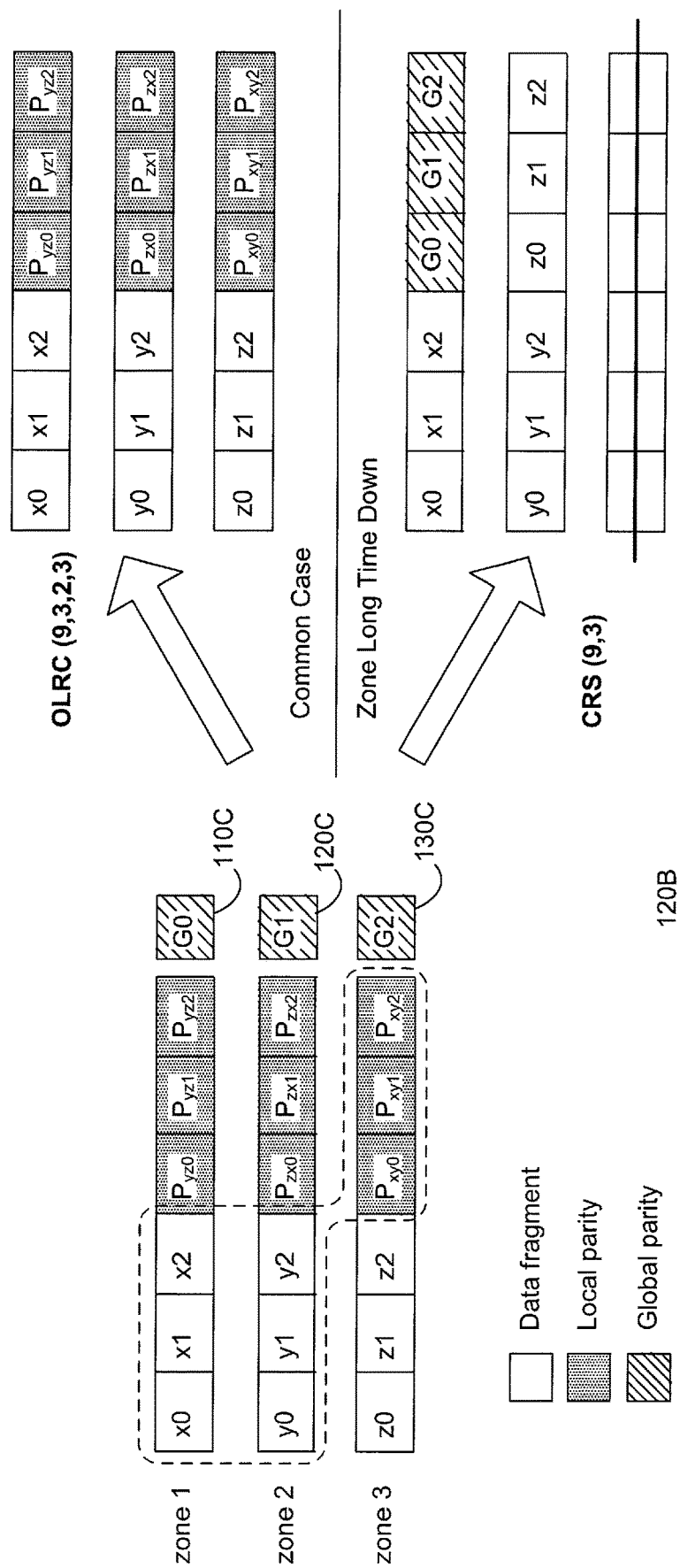
FIG. 5 is a schematic diagram showing an example erasure coding scheme, in accordance with embodiments of the present invention.

Embodiments of the present invention contemplate more efficient alternate zone long-term downtime recovery operations. With reference to FIG. 5, FIG. 5 illustrates data chunk 100 arranged in zones using interlaced placement. Data chunk 100 arrangement corresponds to FIG. 4 discussed above. FIG. 5 further includes the global parity fragments in global parity portions (i.e., global parity portion 110C, 120C, and 130C) corresponding to zone 1, zone 2, and zone 3. FIG. 5 illustrates erasure coding that supports maintaining fault properties during node failures. For example, local parity fragments can be converted to global parity fragments by adopting a new encoding matrix in zone down cases; as a result, the alternate zone long-term downtime recovery operations can skip performing expensive codec transitions. In this converted OLRC scheme, a new variable g is introduced to represent a number of global parity fragments. As such, the OLRC is represented as: OLRC (k, z, l, n, g). As in the previous 3 zone examples, g is 3 in this new scheme. The alternate zone long-term downtime recovery operations control which parity fragments are really needed to be placed and replicated in different cases. Under the common case, only keeping the local parity fragments, it would result in the OLRC (9,3,2,3). By keeping the data fragments and the global parity fragments and deleting all local parity fragments, the remaining fragments form the CRS (9, 3) distribution, as shown FIG. 5. As such, this obviates the need for extra codec transition which is time consuming and involves undoing erasure coding to replicates, and then redoing erasure coding with new codecs. Under the new coding scheme, the network cost would be 1.56× only; compared to the codec transition approach, this approach has more than 3 times network bandwidth saved.

Advantageously, the embodiments described herein improve computing operations that result in computing efficiency in processing data access requests in a zone redundant storage system. In particular, improvements to operations for the common case (i.e., storage node failures) are optimized while maintaining the reconstruction costs for the uncommon case (i.e., zone failures). Moreover, OLRC with global parities further supports zone long-term downtime operations for disaster recovery. Overall, these improvements result in less CPU computation, smaller memory requirements, and increased flexibility in erasure coding, high availability and disaster recovery in a distributed computing system.

Figure 6:
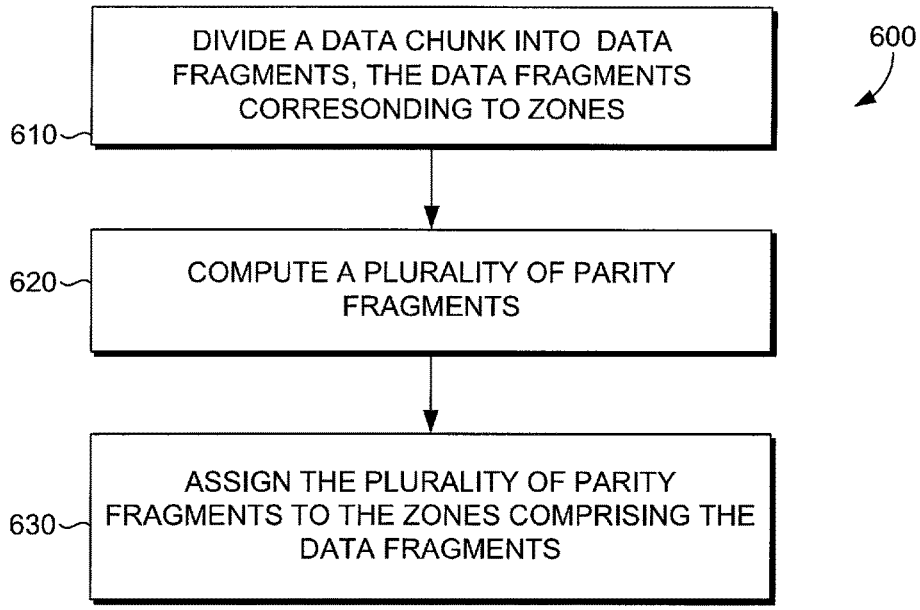
FIG. 6 is a flow diagram illustrating an example method for providing erasure coding using overlapped local reconstruction codes, in accordance with embodiments of the present invention.
Figure 7:
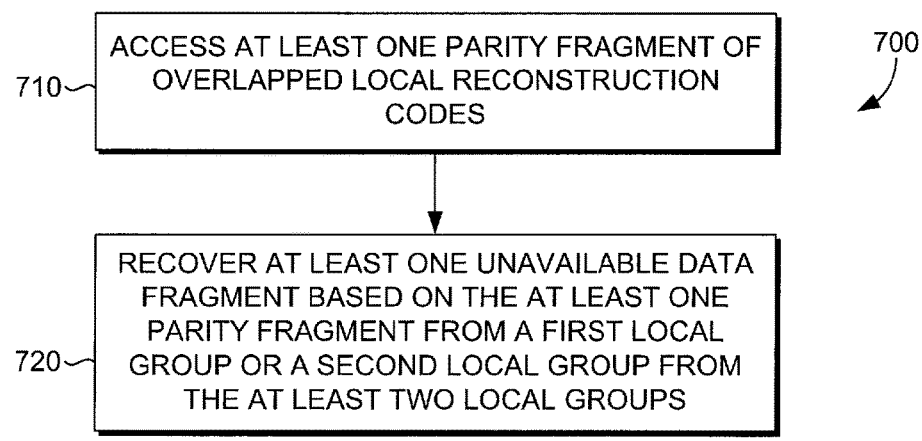
FIG. 7 is a flow diagram illustrating an example method for providing data recovery using overlapped local reconstruction codes, in accordance with embodiments of the present invention.

With reference to FIG. 6 and FIG. 7, FIG. 6 and FIG. 7 illustrate flow diagrams of methods for implementing erasure coding using overlapped local reconstruction codes and data recovery using overlapped local reconstruction codes respectively. The methods can be performed using the distributed computing system described herein. In embodiments, one or more computer storage media having computer-executable instructions embodied thereon that, when executed, by one or more processors, can cause the one or more processors to perform the methods in the system 800.

Turning now to FIG. 6, a flow diagram is provided that illustrates a method 600 for erasure encoding data with overlapped local reconstruction codes. Initially, at block 610, a data chunk is divided into data fragments, the data fragments corresponding to zones. At block 620, a plurality of parity fragments are computed. A parity fragment is computed using a subset of the data fragments. The subset of the data fragments used to compute the parity fragment is from at least two different zones.

For horizontal placement, a subset of the plurality of parity fragments is assigned using a horizontal placement operation. The horizontal placement operation places the subset of the plurality of parity fragments in a horizontal placement zone. The horizontal placement zone is selected from one of at least two zones having the source data fragments used in computing the subset of the plurality of parity fragments. For interlaced placement, a subset of the plurality of parity fragments is assigned using an interlaced placement operation. The interlaced placement operation places the subset of the plurality of parity fragments in an interlaced placement zone, where the interlaced placement zone is different from zones having source data fragments used in computing the subset of the plurality of parity fragments.

At block 630, the plurality of parity fragments are assigned to the zones comprising the data fragments. The data fragments and the plurality of parity fragments define overlapped local reconstruction codes having a plurality of local groups, where an unavailable data fragment is recoverable from at least two local groups from the plurality of local groups. A subset of the data fragments used to compute a subset of the plurality of parity fragments define a local group comprising the subset of data fragments and the subset of the plurality of parity fragments. An unavailable zone corresponding to an unavailable local group is recoverable from remaining available zones, where the unavailable local group fragments are recoverable from available local groups from the available zones.

Turning now to FIG. 7, a flow diagram is provided that illustrates a method 700 for data recovery with overlapped local reconstruction codes. Initially, at block 710, at least one parity fragment of overlapped local reconstruction codes having a plurality of local groups is accessed. Unavailable data fragments are recoverable from at least two local groups from the plurality of local groups. The overlapped local reconstruction codes are generated based on a horizontal placement operation or an interlaced placement operation.

At block 720, at least one unavailable data fragment is recovered based on the at least one parity fragment from a first local group or a second local group from the at least two local groups. The first local group supports a primary-local-group type recovery and the second local group supports a second-local-group type recovery. The at least one unavailable data fragment is recovered from the overlapped local reconstruction codes in interlaced placement, where the overlapped reconstruction codes are recoverable from a failure comprising an unavailable zone and at least one additional unavailable fragment. The overlapped local reconstruction codes further include a plurality of global parity fragments, where recovering the at least one unavailable data fragment comprises at least reassigning at least two of the global parity fragments to the same zone. Reassigning the at least two global parity fragments may be performed only upon attempting and facility to recover the at least one unavailable data fragment from the two local groups.

Figure 8:
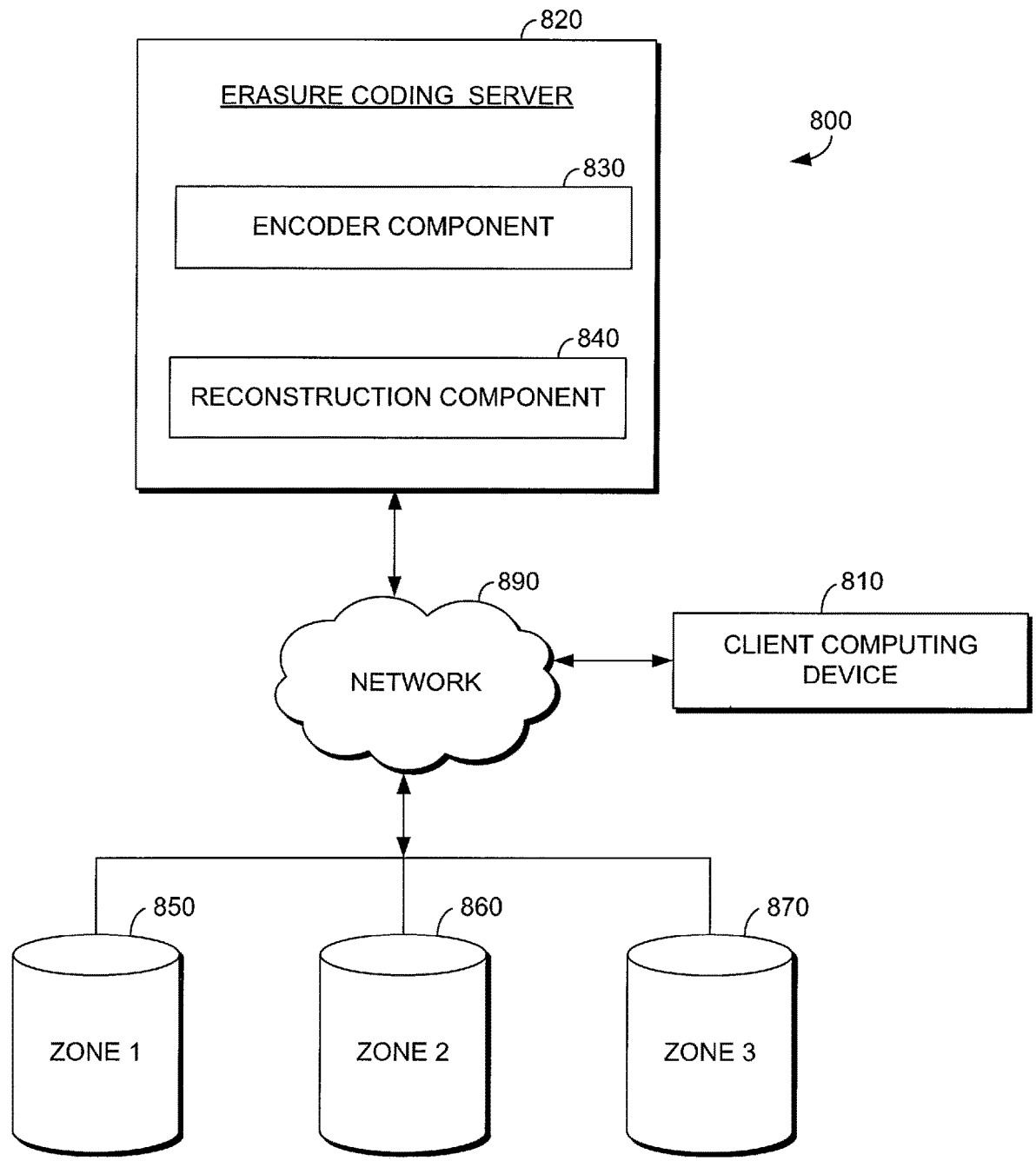
FIG. 8 is a block diagram of an example distributed computing system suitable for use in implementing embodiments of the present invention.

Turning to FIG. 8 the client computing device 810 may include any type of computing device, such as the computing device 900 described with reference to FIG. 9, for example. A plurality of client computing devices 810 may be associated with the distributed computing system 800 (or distributed storage system). The client computing device 810 may be used to retrieve data stored any of the one or more zones described herein.

Zones may refer to particular buildings, data centers, and geographic regions providing a storage service. For example, a data center may be implemented as a cloud computing environment that is configured to allocate virtual machines within the data center for use by a service application. Erasure coding across multiple zones encompasses providing erasure coding at any level of fault tolerance defined by the storage service in the zone. It will be understood and appreciated by those of ordinary skill in the art that the information stored in association with the zone may be configurable and may include any information relevant to, among other things, erasure coding data including data chunks, local parities, and zone parities. The content and volume of such information are not intended to limit the scope of embodiments of the present invention in any way.

Further, though illustrated as a single, independent component, the zones may, in fact, be a plurality of components including storage devices, for instance a collection of racks and servers and, another external computing device (not shown), and/or any combination thereof. As such, providing zone fault-tolerance allows zones to have the capacity to continue to operate in the event of the accidental or deliberate loss of service in components of the zone that impact access or cause data loss. Accidental loss of service may include failures in storage, transmission or process components e.g., power failure, hardware failure, internet service provider (ISP) failure or data corruption. Regional zone failures may be associated with natural disasters, earthquakes, flood, tornadoes, etc. that cause data loss. Deliberate loss of service may include planned network outages (e g, maintenance outages) during which the data in a zone is unavailable.

As zones are large-scale storage systems, the recovery operations due to large-scale outages are supported by embodiments in the present embodiments. The implementation of erasure coding across zones, however, creates a different set of implementation constraints. For example, with continued reference to FIG. 8, the network 890 may include, without limitation, one or more local area networks (LANs) and/or wide area networks (WANs). Such networking environments are commonplace in offices, enterprise-wide computer networks, intranets and the Internet. With embodiments of the present invention, the cost dimension and performance dimensions for the erasure scheme are associated with the distributed computing system zones (e.g., zone-1 850, zone-2 860 and zone-3 870). The distributed computing system 800 may include several sub-storage systems each within a single zone. Each of the sub-systems may be linked together by the network 890 backbone spanning across the zones. As such, total cost may be determined based on a single-zone sub-storage system and cross-zone network backbone. The single-zone sub-storage system may be a function of the storage overhead—the total amount of physical storage space required to store a specified amount of user data. The cross-zone network backbone may be a function of the amount of network bandwidth to be provisioned to support the storage system.

The performance metric may refer to the ability to recover from different types of failure scenarios. Different types of zone failures have different impacts on system performance. As such, for example, when a storage node or a fault domain within a zone fails, the system runs in a degraded mode. However, when an entire zone fails, the system runs in a disaster mode. In order to characterize performance, for example, in a degraded mode, a degraded read cost (i.e., the number of disk I/Os required to read one unit of user data from failed storage node) may be defined. Similarly a disaster read cost may be defined as the number of disk I/Os required to read one unit of user data that was in a failed zone. Disk I/Os are contemplated to include network transfer costs for communicating data. The reliability metric may also be a function of the network 890 in that the reliability is based upon the ability to reconstruct data after one or more machines fails or becomes unavailable. For example, reliability may be evaluated based on a Mean Time to Data Loss (MTTDL).

The erasure coding server 820 of FIG. 8 is generally configured to receive and communicate information for erasure coding. Information may generally include, communications (e.g., requests for encoding or reconstructing data) and/or actual data chunks that are encoded with erasure coding scheme described herein. As illustrated, the erasure coding server 820 includes an encoder component 830 and a reconstruction component 840. The erasure coding server 820 has access to the different zones. For example, the erasure coding server 820 may receive and send data (e.g., data chunks) to the different zones. Data chunks may be data that need to be encoded or may be data that have been recovered. It is contemplated that the data may also be received from an external storage component (not shown) that is not in one of the zones shown.

An embodiment of the present invention may include a plurality of erasure coding servers 820 each associated with several zones, where data at the zones is processed according to embodiments of the present invention. Further, the erasure coding server 820 may be associated with an interface with interface elements that facilitate functions executed by the erasure coding server. For example, interface element may provide for selection of particular erasure coding scheme for particular chunks of data. Interface elements may provide information on particular dimensions and implementation constraints associated with the erasure coding schemes such that a scheme may be selected based on particular considerations associated with an entity (e.g., tenant having a service application) storing the data. Any and all such variations and any combinations of interface elements to realize embodiments of the present invention are contemplated to be within the scope.

The encoder component 830 of the erasure coding server 830 is configured to receive requests to encode data. A data chunk may be received along with a selected erasure coding scheme for encoding the data chunk. The encoder component 830 may also determine and/or select the type of erasure coding that is implemented for the data chunk. Determining an erasure coding scheme is based at least in part on dimensions (e.g., cost, performance, and reliability) associated with the encoding scheme. Selecting an erasure encoding scheme may be facilitated by interface elements of the erasure coding server.

In particular, the goals of an entity (e.g., a tenant associated with a cloud computing platform) storing a data chunk may be aligned with a coding scheme that achieves the goals. For example, an entity may value a first encoding scheme over a second encoding scheme in that the scheme affords better performance. Further, the encoder component 830 is configured to execute encoding steps associated with the different coding schemes. As discussed in more detail below, the steps for encoding data chunks are performed by the encoder component 830. For example, the encoder component divides data into chunks, computes different parities, identifies the location for the data chunks and parities, and communicates the data chunks as directed by each erasure coding scheme.

The reconstruction component 850 of the erasure coding server 830 is configured to receive requests to reconstruct or recover data. As discussed, data loss may be either accidental or deliberate data loss. A portion of an encoded data chunk to be recovered may be identified by the reconstruction component 850 along with an associated erasure coding scheme for recovering the portion of the encoded data chunk. It is contemplated that information of data loss and/or details of data to be recovered may be communicated from an external source (not shown) to the reconstruction component that then recovers the portion of the encoded data. Similar to the encoding data chunks, the reconstruction process may also be facilitated by interface elements of the erasure coding server 820. The encoder component 830 is configured to recover portions of the encoded data chunk according to the coding schemes. In particular, an erasure coding scheme and local or zone parities associated with the portion of the data chunk to be recovered. As discussed in more detail herein, the steps and components for reconstruction portions of the data chunk vary based on the erasure coding scheme.

With continued reference to the distributed computing system 800, embodiments described herein support storing and retrieving data objects across global data centers to maximize utilization of computing resources in a distributed computing system. In particular, the distributed computing system implements a strongly consistent, versioned object store that encodes objects across global data centers. The distributed computing system components refer to integrated components for distributed computing system management. The integrated components refer to the hardware architecture and software framework that support distributed computing system management functionality using the distributed computing system. The hardware architecture refers to physical components and interrelationships thereof and the software framework refers to software providing functionality that can be implemented with hardware embodied on a device. The end-to-end software-based distributed computing system can operate within the distributed computing system components to operate computer hardware to provide distributed computing system functionality. As such, the distributed computing system components can manage resources and provide services for the distributed computing system functionality. Any other variations and combinations thereof are contemplated with embodiments of the present invention.

By way of example, the distributed computing system can include an API library that includes specifications for routines, data structures, object classes, and variables may support the interaction between the hardware architecture of the device and the software framework of the distributed computing system. These APIs include configuration specifications for the distributed computing system such that the different components therein can communicate with each other in the distributed computing system, as described herein.

Having described embodiments of the present invention, an exemplary operating environment in which embodiments of the present invention may be implemented is described below in order to provide a general context for various aspects of the present invention. Referring initially to FIG. 9 in particular, an exemplary operating environment for implementing embodiments of the present invention is shown and designated generally as computing device 900. Computing device 900 is but one example of a suitable computing environment and is not intended to suggest any limitation as to the scope of use or functionality of the invention. Neither should the computing device 900 be interpreted as having any dependency or requirement relating to any one or combination of components illustrated.

The invention may be described in the general context of computer code or machine-useable instructions, including computer-executable instructions such as program modules, being executed by a computer or other machine, such as a personal data assistant or other handheld device. Generally, program modules including routines, programs, objects, components, data structures, etc. refer to code that perform particular tasks or implement particular abstract data types. The invention may be practiced in a variety of system configurations, including hand-held devices, consumer electronics, general-purpose computers, more specialty computing devices, etc. The invention may also be practiced in distributed computing environments where tasks are performed by remote-processing devices that are linked through a communications network.

Figure 9:
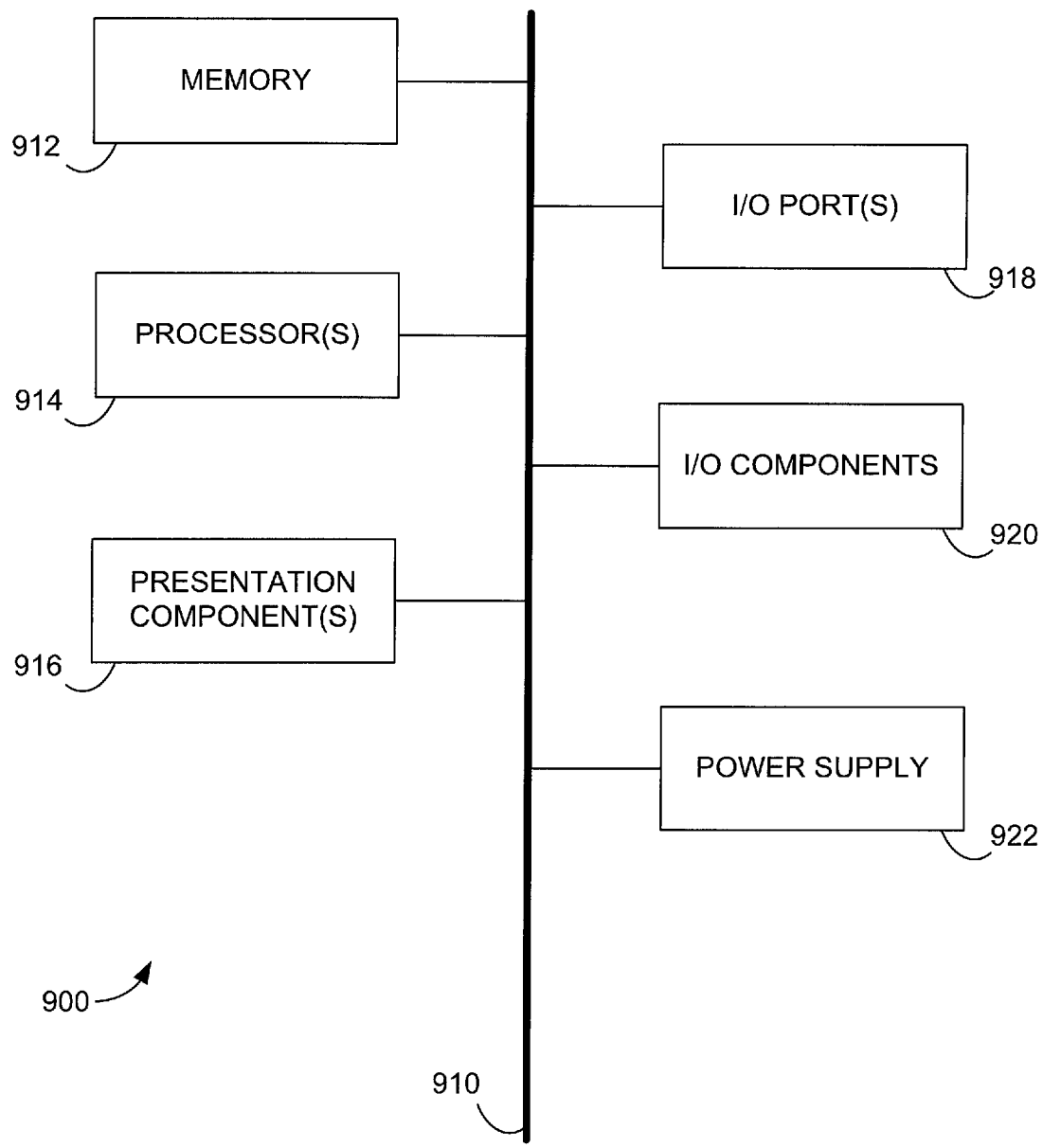
FIG. 9 is a block diagram of an example computing environment suitable for use in implementing embodiments of the present invention.

With reference to FIG. 9, computing device 900 includes a bus 910 that directly or indirectly couples the following devices: memory 912, one or more processors 914, one or more presentation components 916, input/output ports 918, input/output components 920, and an illustrative power supply 922. Bus 910 represents what may be one or more busses (such as an address bus, data bus, or combination thereof). Although the various blocks of FIG. 9 are shown with lines for the sake of clarity, in reality, delineating various components is not so clear, and metaphorically, the lines would more accurately be grey and fuzzy. For example, one may consider a presentation component such as a display device to be an I/O component. Also, processors have memory. We recognize that such is the nature of the art, and reiterate that the diagram of FIG. 9 is merely illustrative of an exemplary computing device that can be used in connection with one or more embodiments of the present invention. Distinction is not made between such categories as "workstation," "server," "laptop," "hand-held device," etc., as all are contemplated within the scope of FIG. 9 and reference to "computing device."

Computing device 900 typically includes a variety of computer-readable media. Computer-readable media can be any available media that can be accessed by computing device 900 and includes both volatile and nonvolatile media, removable and non-removable media. By way of example, and not limitation, computer-readable media may comprise computer storage media and communication media.

Computer storage media include volatile and nonvolatile, removable and non-removable media implemented in any method or technology for storage of information such as computer-readable instructions, data structures, program modules or other data. Computer storage media includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which can be used to store the desired information and which can be accessed by computing device 100. Computer storage media excludes signals per se.

Communication media typically embodies computer-readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. Combinations of any of the above should also be included within the scope of computer-readable media.

Memory 912 includes computer storage media in the form of volatile and/or nonvolatile memory. The memory may be removable, non-removable, or a combination thereof. Exemplary hardware devices include solid-state memory, hard drives, optical-disc drives, etc. Computing device 900 includes one or more processors that read data from various entities such as memory 912 or I/O components 920. Presentation component(s) 916 present data indications to a user or other device. Exemplary presentation components include a display device, speaker, printing component, vibrating component, etc.

I/O ports 918 allow computing device 900 to be logically coupled to other devices including I/O components 920, some of which may be built in. Illustrative components include a microphone, joystick, game pad, satellite dish, scanner, printer, wireless device, etc.

Embodiments described in the paragraphs below may be combined with one or more of the specifically described alternatives. In particular, an embodiment that is claimed may contain a reference, in the alternative, to more than one other embodiment. The embodiment that is claimed may specify a further limitation of the subject matter claimed.

The subject matter of embodiments of the invention is described with specificity herein to meet statutory requirements. However, the description itself is not intended to limit the scope of this patent. Rather, the inventors have contemplated that the claimed subject matter might also be embodied in other ways, to include different steps or combinations of steps similar to the ones described in this document, in conjunction with other present or future technologies. Moreover, although the terms "step" and/or "block" may be used herein to connote different elements of methods employed, the terms should not be interpreted as implying any particular order among or between various steps herein disclosed unless and except when the order of individual steps is explicitly described.

For purposes of this disclosure, the word "including" has the same broad meaning as the word "comprising," and the word "accessing" comprises "receiving," "referencing," or "retrieving." Further the word "communicating" has the same broad meaning as the word "receiving," or "transmitting" facilitated by software or hardware-based buses, receivers, or transmitters" using communication media described herein. Also, the word "initiating" has the same broad meaning as the word "executing or "instructing" where the corresponding action can be performed to completion or interrupted based on an occurrence of another action. In addition, words such as "a" and "an," unless otherwise indicated to the contrary, include the plural as well as the singular. Thus, for example, the constraint of "a feature" is satisfied where one or more features are present. Also, the term "or" includes the conjunctive, the disjunctive, and both (a or b thus includes either a or b, as well as a and b).

For purposes of a detailed discussion above, embodiments of the present invention are described with reference to a distributed computing environment; however the distributed computing environment depicted herein is merely exemplary. Components can be configured for performing novel aspects of embodiments, where the term "configured for" can refer to "programmed to" perform particular tasks or implement particular abstract data types using code. Further, while embodiments of the present invention may generally refer to the distributed computing system and the schematics described herein, it is understood that the techniques described may be extended to other implementation contexts.

Embodiments of the present invention have been described in relation to particular embodiments which are intended in all respects to be illustrative rather than restrictive. Alternative embodiments will become apparent to those of ordinary skill in the art to which the present invention pertains without departing from its scope.

What is claimed is:

1. A system for erasure coding with overlapped local reconstruction codes, the system comprising:
an encoding component configured to:
divide a data chunk into data fragments comprising a first set of data fragments corresponding to a first zone, a second set of data fragments corresponding to a second zone, and a third set of data fragments corresponding to a third zone;
compute a plurality of parity fragments based on a subset of the data fragments, wherein a parity fragment is computed using the first set of data fragments for the first zone and the second set of data fragments for the second zone;
assign the plurality of parity fragments to the first zone to define a first local group of a plurality of local groups for overlapped local reconstruction codes, wherein an unavailable data fragment is recoverable from at least two local groups of the plurality of local groups, and the first local group comprises:
the first set of data fragments;
the second set of data fragments; and
the plurality of parity fragments; and
define a second local group of the plurality of local groups, the second local group comprising:
the second set of data fragments;
the third set of data fragments; and
a plurality of parity fragments corresponding to the second set of data fragments and the third set of data fragments; and
a reconstruction component configured to:
access at least one parity fragment of the overlapped local construction codes; and
recover at least one unavailable data fragment based on the at least one parity fragment from the first local group or a second local group from the at least two local groups.

2. The system of claim 1, wherein a subset of the plurality of parity fragments are assigned using a horizontal placement operation, wherein the horizontal placement operation places the subset of the plurality of parity fragments in a horizontal placement zone, wherein the horizontal placement zone is selected from one of at least two zones having source data fragments used in computing the subset of the plurality of parity fragments.

3. The system of claim 1, wherein a subset of the plurality of parity fragments are assigned using an interlaced placement operation, wherein the interlaced placement operation places the subset of the plurality of parity fragments in an interlaced placement zone, wherein the interlaced placement zone is different from zones having source data fragments used in computing the subset of the plurality of parity fragments.

4. The method of claim 1, wherein a subset of the data fragments used to compute a subset of the plurality of parity fragments define a local group comprising the subset of data fragments and the subset of the plurality of parity fragments.

5. The system of claim 1, wherein a local group comprises n parity fragments, wherein the local group tolerates n unavailable data fragments or parity fragments.

6. The system of claim 1, wherein an unavailable zone corresponding to an unavailable local group is recoverable from remaining available zones, wherein the unavailable local group fragments are recoverable from available local groups from the available zones.

7. The system of claim 1, wherein the overlapped local reconstruction codes further include a plurality of global parity fragments, wherein recovering the at least one unavailable data fragment comprises at least reassigning at least two of the global parity fragments to the same zone.

8. The system of claim 1, wherein the plurality of local groups further comprises a third local group, comprising:
   the third set of data fragments;
   the first set of data fragments; and
   a plurality of parity fragments corresponding to the third set of data fragments and the first set of data fragments.

9. A computer-implemented method for erasure coding with overlapped local reconstruction codes, the method comprising:
   dividing a data chunk into data fragments comprising a first set of data fragments corresponding to a first zone, a second set of data fragments corresponding to a second zone, and a third set of data fragments corresponding to a third zone;
   computing a plurality of parity fragments based on a subset of the data fragments, wherein a parity fragment is computed using the first set of data fragments for the first zone and the second set of data fragments for the second zone;
   assigning the plurality of parity fragments to the first zone to define a first local group of a plurality of local groups for overlapped local reconstruction codes, wherein an unavailable data fragment is recoverable from at least two local groups of the plurality of local groups, and the first local group comprises:
      the first set of data fragments;
      the second set of data fragments; and
      the plurality of parity fragments; and
   define a second local group of the plurality of local groups, the second local group comprising:
      the second set of data fragments;
      the third set of data fragments; and
      a plurality of parity fragments corresponding to the second set of data fragments and the third set of data fragments.

10. The computer-implemented method of claim 9, wherein the plurality of local groups further comprises a third local group, comprising:
    the third set of data fragments;
    the first set of data fragments; and
    a plurality of parity fragments corresponding to the third set of data fragments and the first set of data fragments.

11. The method of claim 9, wherein a subset of the plurality of parity fragments are assigned using a horizontal placement operation, wherein the horizontal placement operation places the subset of the plurality of parity fragments in a horizontal placement zone, wherein the horizontal placement zone is selected from one of at least two zones having source data fragments used in computing the subset of the plurality of parity fragments.

12. The method of claim 9, wherein a subset of the plurality of parity fragments are assigned using an interlaced placement operation, wherein the interlaced placement operation places the subset of the plurality of parity fragments in an interlaced placement zone, where the interlaced placement zone is different from zones having source data fragments used in computing the subset of the plurality of parity fragments.

13. The method of claim 9, wherein a subset of the data fragments used to compute a subset of the plurality of parity fragments define a local group comprising the subset of data fragments and the subset of the plurality of parity fragments.

14. The method of claim 9, wherein an unavailable zone corresponding to an unavailable local group is recoverable from remaining available zones, wherein the unavailable local group fragments are recoverable from available local groups from the available zones.

15. One or more computer storage media having computer-executable instructions embodied thereon that, when executed, by one or more processors, cause the one or more processors to perform a method for providing erasure coding with overlapped local reconstruction codes, the method comprising:
   accessing at least one parity fragment of overlapped local reconstruction codes having a plurality of local groups, wherein unavailable data fragments are recoverable from at least two local groups from the plurality of local groups, the plurality of local groups comprising:
      a first local group, comprising:
         a first set of data fragments corresponding to a first zone;
         a second a second set of data fragments corresponding to a second zone; and
         a plurality of parity fragments corresponding to the first set of data fragments for the first zone and the second set of data fragments for the second zone; and
      a second local group, comprising:
         the second set of data fragments;
         a third set of data fragments corresponding to a third zone; and
         a plurality of parity fragments corresponding to the second set of data fragments and the third set of data fragments; and
   recovering at least one unavailable data fragment based on the at least one parity fragment from the first local group or the second local group.

16. The media of claim 15, wherein the overlapped local reconstruction codes are generated based on a horizontal placement operation or an interlaced placement operation.

17. The media of claim 15, wherein the first local group supports a primary-local-group type recovery and the second local group supports a second-local-group type recovery.

18. The media of claim 15, wherein an unavailable zone corresponding to an unavailable local group is recoverable from remaining available zones, wherein the unavailable local group fragments are recoverable from available local groups from the available zones.

19. The media of claim 15, wherein the at least one unavailable data fragment is recovered from the overlapped local reconstruction codes in interlaced placement, wherein the overlapped reconstruction codes are recoverable from a failure comprising an unavailable zone and at least one additional unavailable fragment.

20. The media of claim 15, wherein the overlapped local reconstruction codes further include a plurality of global parity fragments, wherein recovering the at least on unavailable data fragment comprises at least reassigning at least two of the global parity fragments to the same zone.

* * * * *